(12) United States Patent
Song et al.

(10) Patent No.: US 11,703,965 B2
(45) Date of Patent: Jul. 18, 2023

(54) DISPLAY DEVICE

(71) Applicant: Samsung Display Co., LTD., Yongin-si (KR)

(72) Inventors: Changyeong Song, Suwon-si (KR); Jongwoo Kim, Hwaseong-si (KR); Yongchan Ju, Yongin-si (KR); Jaeheung Ha, Suwon-si (KR); Wonjong Kim, Suwon-si (KR); Heeyeon Park, Seoul (KR); Hyein Yang, Siheung-si (KR); Woosuk Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/239,792

(22) Filed: Apr. 26, 2021

(65) Prior Publication Data
US 2022/0057876 A1 Feb. 24, 2022

(30) Foreign Application Priority Data
Aug. 18, 2020 (KR) .................. 10-2020-0103542

(51) Int. Cl.
*G09G 3/30* (2006.01)
*G06F 3/041* (2006.01)
*G06F 3/044* (2006.01)
*H10K 50/844* (2023.01)
*H10K 59/38* (2023.01)
*H10K 59/40* (2023.01)
*H10K 59/122* (2023.01)

(52) U.S. Cl.
CPC .......... *G06F 3/0412* (2013.01); *G06F 3/0443* (2019.05); *G06F 3/0446* (2019.05); *H10K 50/844* (2023.02); *H10K 59/122* (2023.02); *H10K 59/38* (2023.02); *H10K 59/40* (2023.02); *G06F 2203/04111* (2013.01)

(58) Field of Classification Search
CPC .... G06F 3/0412; G06F 3/0446; G06F 3/0443; G06F 2203/04111; H01L 27/322; H01L 27/323; H01L 27/3246; H01L 51/5253; H10K 59/40; H10K 59/122; H10K 59/38
USPC ........................................... 345/76
See application file for complete search history.

(56) References Cited

U.S. PATENT DOCUMENTS

| | | | | |
|---|---|---|---|---|
| 2016/0165074 A1* | 6/2016 | Kusakabe | ............... | H04N 1/41 358/1.15 |
| 2017/0062765 A1* | 3/2017 | Yang | ............... | G02B 5/0242 |
| 2019/0027547 A1* | 1/2019 | Kim | ............... | H01L 27/3272 |
| 2019/0095018 A1* | 3/2019 | Shin | ............... | G06F 3/0443 |

(Continued)

FOREIGN PATENT DOCUMENTS

| KR | 101360782 B1 | 2/2014 |
|---|---|---|
| KR | 1020190000553 A | 1/2019 |

(Continued)

*Primary Examiner* — Jennifer T Nguyen
(74) *Attorney, Agent, or Firm* — Cantor Colburn LLP (57) ABSTRACT

A display device includes a light-emitting element, an encapsulation layer covering the light-emitting element and including an organic thin film, an organic dielectric layer on the encapsulation layer and an input-sensing part on the organic dielectric layer. The organic dielectric layer includes an organic material and has a thickness smaller than a thickness of the organic layer of the encapsulation layer.

19 Claims, 6 Drawing Sheets

(56) References Cited

U.S. PATENT DOCUMENTS

| | | | | |
|---|---|---|---|---|
| 2019/0165074 A1* | 5/2019 | Lee | ...................... | H01L 27/323 |
| 2020/0125196 A1* | 4/2020 | Okuno | .................. | H01L 27/288 |

FOREIGN PATENT DOCUMENTS

| | | |
|---|---|---|
| KR | 1020190073061 A | 6/2019 |
| KR | 1020190080312 A | 7/2019 |
| KR | 1020190096470 A | 8/2019 |
| KR | 102078271 B1 | 2/2020 |
| KR | 1020200022067 A | 3/2020 |

* cited by examiner

DISPLAY DEVICE

This application claims priority to Korean Patent Application No. 10-2020-0103542 filed on Aug. 18, 2020, and all the benefits accruing therefrom under 35 U.S.C. § 119, the entire disclosure of which is incorporated by reference herein.

BACKGROUND

1. Field

Embodiments relate to a display device. More particularly, embodiments relate to a display device including an input-sensing part.

2. Description of the Related Art

A display device may include an input-sensing part to detect an external input to the display device.

A display device including an organic light-emitting element may include an encapsulation layer covering the organic light-emitting element, and an input-sensing part may be on the encapsulation layer.

SUMMARY

Embodiments provide a display device including an input-sensing part with improved sensitivity According to an embodiment, a display device includes a light-emitting element, an encapsulation layer covering the light-emitting element and including an organic thin film, an organic dielectric layer on the encapsulation layer and an input-sensing part on the organic dielectric layer. The organic dielectric layer includes an organic material and has a thickness smaller than a thickness of the encapsulation layer.

In an embodiment, the organic dielectric layer may have a dielectric constant smaller than a dielectric constant of the organic thin film, and the dielectric constant of the organic dielectric layer may be equal to or less than about 2.7 farads per meter (F/m).

In an embodiment, a ratio of the thickness of the organic dielectric layer to the thickness of the organic thin film may be about 1:4 to about 1:1.5.

In an embodiment, a sum of the thickness of the organic dielectric layer and the thickness of the organic thin film may be about 4 micrometers (μm) to about 10 μm.

In an embodiment, the organic dielectric layer may include hollow particles in the organic material.

In an embodiment, the organic dielectric layer may include nano-pores defined by the organic material.

In an embodiment, the organic dielectric layer may include an acrylic copolymer having monomer, and the monomers of the acrylic copolymer may include an aromatic acrylate.

In an embodiment, the organic material of the organic dielectric layer may include an acrylic resin, an epoxy resin or a siloxane resin.

In an embodiment, the display device may further include a first light-blocking layer between the organic dielectric layer and the encapsulation layer, and an opening in the first light-blocking layer.

In an embodiment, the light-emitting element may include a first electrode, an organic layer on the first electrode, and a second electrode on the organic layer. The display device may include a pixel-defining layer overlapping the first electrode and an opening in the pixel-defining layer.

In an embodiment, the display device may further include a second light-blocking layer on the input-sensing part, and an opening in the second light-blocking layer which overlaps the opening in the first light-blocking layer.

In an embodiment, a width of the opening in the first light-blocking layer may be greater than a width of the opening in the pixel-defining layer, and a width of the opening in the second light-blocking layer may be greater than the width of the opening in the first light-blocking layer.

In an embodiment, the input-sensing part may include a conductive pattern corresponding to the first light-blocking layer and the second light-blocking layer.

In an embodiment, the display device may further include a color filter. The color filter may extend into the opening in the second light-blocking layer.

According to an embodiment, a display device includes a light-emitting element, an encapsulation layer covering the light-emitting element and including an organic thin film, an organic dielectric layer on the encapsulation layer and including an organic material, a first light-blocking layer between the encapsulation layer and the organic dielectric layer, an input-sensing part on the organic dielectric layer, and a color filter on the input-sensing part.

According to the embodiments, an organic dielectric layer having a less permittivity is provided between an encapsulation layer covering a light-emitting element, and an input-sensing part. As a result, an electrical capacitance of a capacitor provided or formed between a conductive pattern of the input-sensing part and an electrode of the light-emitting element is decreased. Thus, a sensitivity of the input-sensing part may be increased.

Furthermore, a light-blocking layer is provided between the organic dielectric layer and the encapsulation layer. Thus, mixing of color light emitted from pixels may be reduced or prevented.

BRIEF DESCRIPTION OF THE DRAWINGS

One or more embodiments of the invention will be more clearly understood from the following detailed description taken in conjunction with the accompanying drawings.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Since an organic light-emitting element 190 of a display device 10 includes an electrode receiving a high power voltage, a sensitivity of an input-sensing part 300 of the display device 10 may be varied depending on a capacitance between an electrode of the organic light-emitting element and a conductive pattern of the input-sensing part 300.

A display device 10 will be described hereinafter with reference to the accompanying drawings, in which embodiments are shown.

Figure 1:
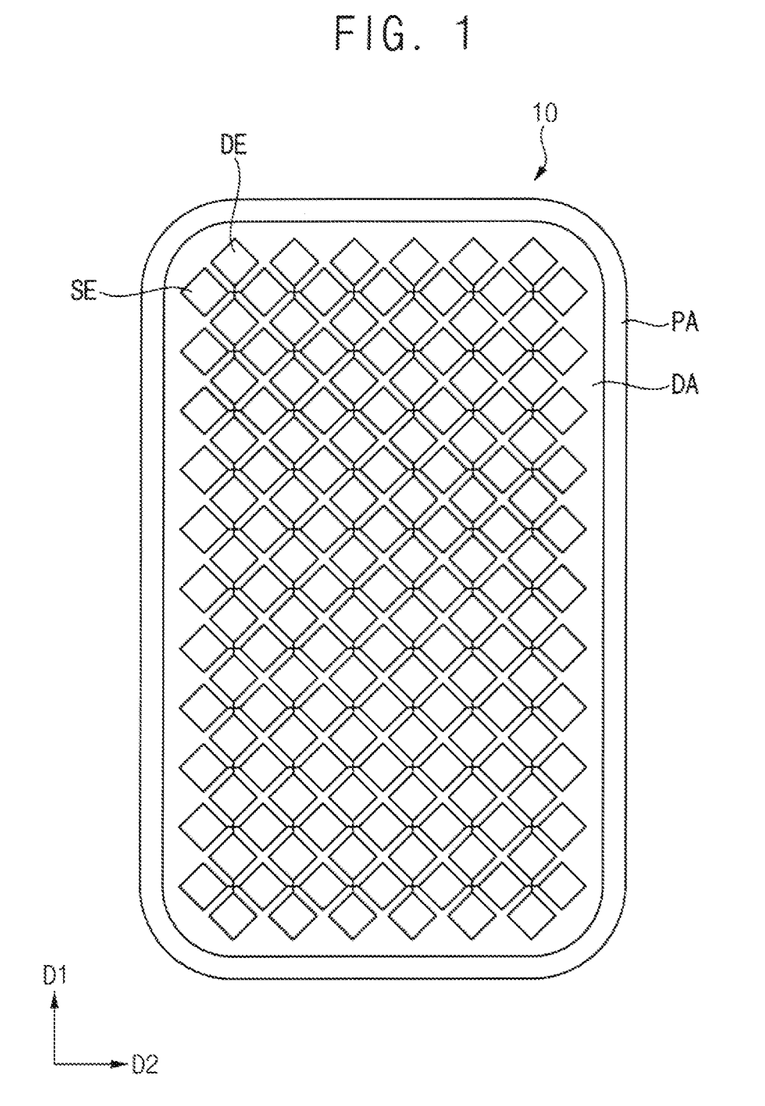
FIG. 1 is a plan view illustrating an embodiment of a display device.
Figure 2:
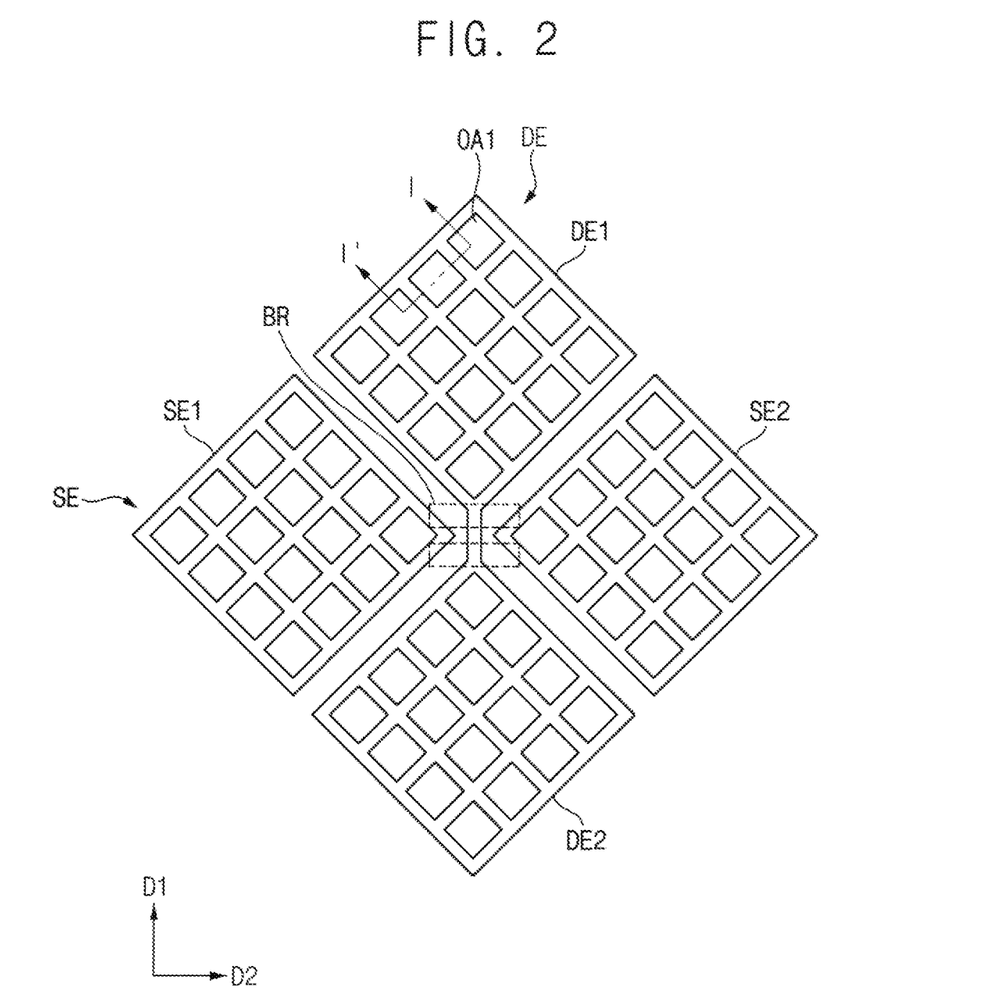
FIG. 2 is an enlarged plan view illustrating an embodiment of a sensing electrode and a driving electrode of an input-sensing part of a display device.
Figure 3:
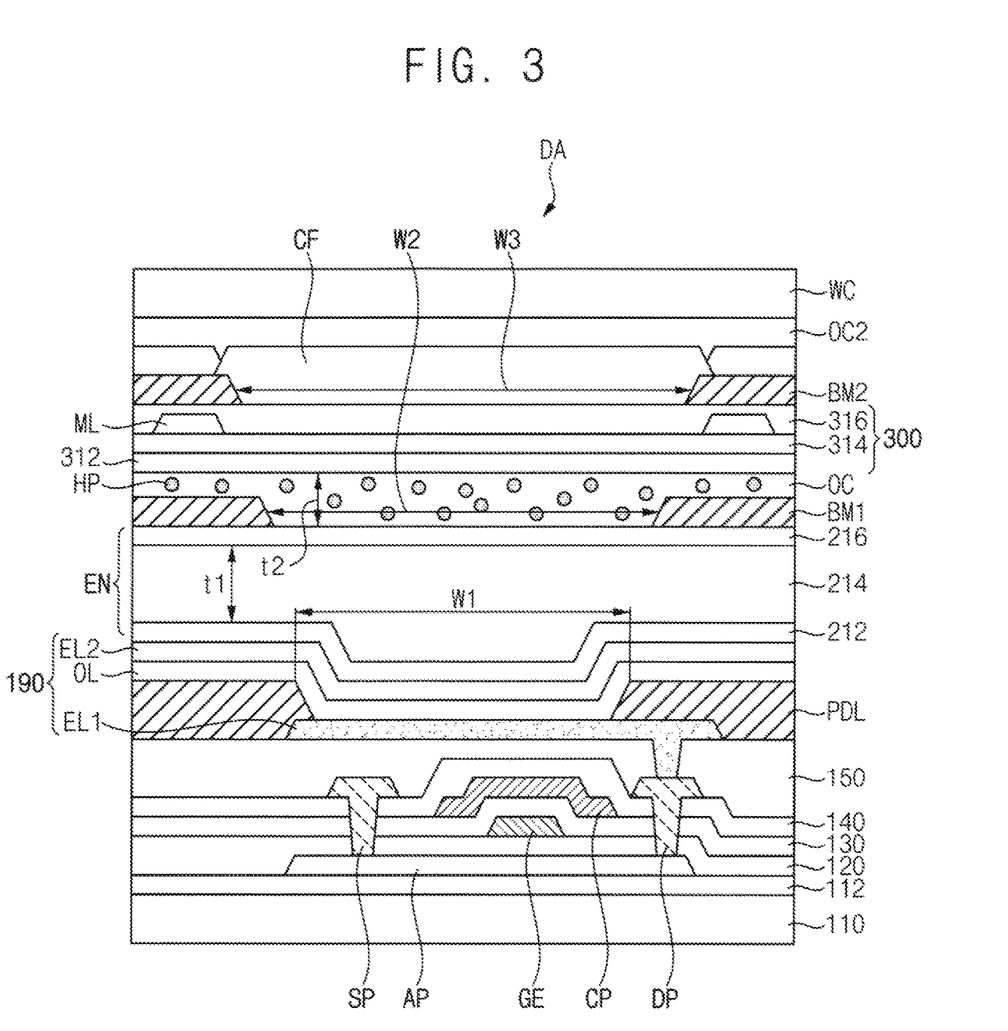
FIG. 3 is a cross-sectional view taken along line I-I' of FIG. 2.

FIG. 1 is a plan view illustrating an embodiment of a display device 10. FIG. 2 is an enlarged plan view illustrating an embodiment of a sensing electrode SE and a driving electrode DE of an input-sensing part 300 of a display device 10. FIG. 3 is a cross-sectional view taken along line I-I' of FIG. 2.

Referring to FIGS. 1 and 2, a display device 10 includes a display area DA in which a pixel is provided in plural such as in an array of pixels to display an image.

In an embodiment, the display device 10 may include an organic light-emitting display panel. In an embodiment, for example, each of the pixels may include a light-emitting element 190 and a driving element which is connected to the light-emitting element 190 and drives the light-emitting element 190. In an embodiment, the light-emitting element 190 may include an organic light-emitting diode. The driving element may include a thin film transistor (or transistor).

An area which is adjacent to the display area DA and does not emit light may be referred to as a peripheral area PA. An image may not be displayed at the peripheral area PA (e.g., non-display area). In an embodiment, for example, the peripheral area PA may surround the display area DA in the plan view. Various layers or components of the display device 10 may include a display area DA and a peripheral area PA corresponding to those described for the display device 10.

The display device 10 includes an input-sensing part 300. In an embodiment, the input-sensing part 300 may be a touch-sensing screen. The touch-sensing screen may be disposed in the display area DA. In an embodiment, for example, the touch-sensing screen may sense an external input by detecting a variation of electrical capacitance thereby obtaining coordinate information of the external input.

In an embodiment, the touch-sensing screen includes conductive electrodes to detect variation of electrical capacitance. In an embodiment, for example, the touch-sensing screen may include a driving electrode DE extending along a first direction D1 and a sensing electrode SE extending along a second direction D2 crossing the first direction D1.

The driving electrode DE may include a plurality of driving electrode patterns arranged along the first direction D1. The sensing electrode DE may include a plurality of sensing electrode patterns arranged along the second direction D2.

A thickness direction of the display device 10 may extend along a third direction which crosses each of the first direction D1 and the second direction D2.

In an embodiment, the driving electrode patterns and the sensing electrode patterns may be disposed in a same layer as each other. In an embodiment, for example, the driving electrode patterns may be continuously connected to each other in a same layer. The sensing electrode patterns may be in a same layer and spaced apart from each other by the driving electrode patterns, but may be electrically connected to each other through a connection pattern BR disposed in a different layer from the layer of the sensing electrode patterns. As being in a same layer, elements may be respective portions or patterns of a same material layer, without being limited thereto.

In an embodiment, for example, as illustrated in FIG. 2, a first driving electrode pattern DE1 and a second driving electrode pattern DE2, which are arranged along the first direction D1 and are adjacent to each other, may be continuously connected to each other. That is, one driving electrode pattern may be extended to define another driving electrode pattern. A first sensing electrode pattern SE1 may be spaced apart from a second sensing electrode pattern SE2 along the second direction D2, and may be electrically connected to each other through the connection pattern BR. In an embodiment, a plurality of connection patterns may connect the first and second sensing electrode patterns SE1 and SE2 to each other. However, embodiments are not limited thereto. In an embodiment, for example, the first and second sensing electrode patterns SE1 and SE2 may be electrically connected to each other by a single one of the connection pattern BR. Since the first sensing electrode pattern SE1 may be spaced apart from the second sensing electrode pattern SE2, each sensing electrode pattern may be a discrete pattern or island pattern.

In an embodiment, for example, the driving electrode patterns and the sensing electrode patterns may be referred to as a first conductive pattern, and the connection pattern BR may be referred to as a second conductive pattern.

In an embodiment, for example, the first conductive pattern and the second conductive pattern may each include a metal material, a conductive metal oxide, a conductive polymer, graphene, carbon nano tube or a combination thereof. In an embodiment, for example, the metal material may include molybdenum, silver, titanium, copper, aluminum or an alloy thereof. In an embodiment, for example, the metal material may be provided to have a shape of a continuous thin film or nano wire. In an embodiment, for example, the conductive metal oxide may include indium tin oxide, indium zinc oxide, zinc tin oxide, indium oxide, zinc oxide, tin oxide or a combination thereof. The first conductive pattern and the second conductive pattern may each have a single-layered structure or a multi-layered structure including different materials from each other.

In an embodiment, the driving electrode DE and the sensing electrode SE may each have a mesh shape.

In an embodiment, for example, the driving electrode DE and the sensing electrode SE may each include a first opening OA1. The first opening OA1 may overlap a light-emitting area of a pixel. A solid portion of the driving electrode DE and the sensing electrode SE may define the first opening OA1. Solid portions of the driving electrode DE and the sensing electrode SE may be spaced apart to define the first opening OA1 therebetween.

Hereinafter, a cross-sectional structure of a display device 10 will be explained. Referring to FIG. 3, in the display area DA of the display device 10, a buffer layer 112 may be disposed on a base substrate 110. An active pattern AP of a transistor may be disposed on the buffer layer 112

In an embodiment, for example, the base substrate 110 may include glass, quartz, silicon, a polymeric material or the like. In an embodiment, the base substrate 110 may include a polymeric material. In an embodiment, for example, the polymeric material may include polyethylene terephthalate, polyethylene naphthalate, polyether ketone, polycarbonate, polyarylate, polyether sulfone, polyimide, polybenzooxazole, polybenzobisoxazole, polybenzoimidazole, polybenzothiazole or a combination thereof. In an embodiment, the base substrate 110 may have a stacked cross-sectional structure including a polymeric film including polyimide and a barrier layer including an inorganic material.

The buffer layer 112 may prevent or reduce penetration of impurities, humidity or external gas from under the base substrate 110 to elements above the base substrate 110, and may reduce a roughness of an upper surface of the base substrate 110. In an embodiment, for example, the buffer layer 112 may include an inorganic material such as silicon oxide, silicon nitride, silicon oxynitride or the like.

The active pattern AP may include a channel region, a source region and a drain region. The source region and the drain region may each be adjacent to the channel region at opposing sides thereof.

A first gate metal pattern may be disposed on the active pattern AP. In an embodiment, for example, the first gate metal pattern may include a gate electrode GE overlapping or corresponding to the channel region of the active pattern AP. A first insulation layer 120 may be disposed between the active pattern AP and the first gate metal pattern.

A second gate metal pattern including a capacitor electrode pattern CP may be disposed on the first gate metal pattern. In an embodiment, for example, the capacitor electrode pattern CP may overlap or correspond to the gate electrode GE.

A second insulation layer 130 may be disposed between the first gate metal pattern and the second gate metal pattern. A third insulation layer 140 may be disposed on the second gate metal pattern.

In an embodiment, for example, the active pattern AP may include a semiconductive material such as amorphous silicon, polycrystalline silicon (polysilicon), a metal oxide or the like. In an embodiment, the active pattern AP may include polysilicon, which may be doped with impurities such as n-type impurities or p-type impurities.

The active pattern AP may include a metal oxide semiconductor. In an embodiment, for example, the active pattern AP may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). In an embodiment, for example, the active pattern AP may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

In an embodiment, for example, the first insulation layer 120, the second insulation layer 130 and the third insulation layer 140 may each include silicon oxide, silicon nitride, silicon oxynitride or a combination thereof. Furthermore, the first insulation layer 120, the second insulation layer 130 and the third insulation layer 140 may each include an insulating metal oxide such as aluminum oxide, tantalum oxide, hafnium oxide, zirconium oxide, titanium oxide or the like. In an embodiment, for example, the first insulation layer 120, the second insulation layer 130 and the third insulation layer 140 may each have a single-layered structure or a multi-layered structure, which may silicon nitride and/or silicon oxide.

In an embodiment, for example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 140. The first source metal pattern may include a source pattern SP and a drain pattern DP of the transistor, which pass through insulation layers thereunder to electrically contact the active pattern AP, respectively. In an embodiment, for example, the source pattern SP may electrically contact the source region of the active pattern AP, and the drain pattern DP may electrically contact the drain region of the active pattern AP.

A fourth insulation layer 150 may be disposed on the first source metal pattern. The fourth insulation layer 150 may compensate for a height difference of structures thereunder to planarize the underlying stepped portions. The fourth insulation layer 150 may include an organic material. In an embodiment, for example, the fourth insulation layer 150 may include an organic material such as a phenolic resin, an acrylic resin, a polyimide resin, a polyamide resin, a siloxane resin, an epoxy resin or the like. The fourth insulation layer 150 may be referred to as a first via insulation layer or a first organic insulation layer.

In an embodiment, for example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an embodiment, the first source metal pattern may have a multi-layered structure including at least an aluminum layer.

A light-emitting element 190 may be disposed on the fourth insulation layer 150. The light-emitting element 190 may include a first electrode EL1, a second electrode EL2 facing the first electrode EL1 and an organic layer OL (e.g., emission layer) between the first electrode EL1 and the second electrode EL2. The first electrode EL1 of the light-emitting element 190 may be electrically connected to the transistor at the drain pattern DP. The light-emitting element 190 generates light, emits light, etc.

A pixel-defining layer PDL disposed on the fourth insulation layer 150 may include a second opening overlapping or corresponding to at least a portion of the first electrode EL1. The first electrode EL1 is exposed outside of the pixel-defining layer PDL at the second opening. The display device 10 may include the pixel-defining layer PDL which covers edges of the first electrode EL1. At least a portion of the organic layer OL may be disposed in the second opening. The organic layer OL may include a common layer extending continuously over a plurality of pixels, but is not limited thereto. In an embodiment, the organic layer OL may be provided or formed as a discrete pattern disposed corresponding to a pixel among the pixels.

In an embodiment, the pixel-defining layer PDL may include a light-blocking material. Thus, the pixel-defining layer PDL may function as a black matrix. In an embodiment, for example, the light-blocking material may include a pigment, a dye, a carbon black or a combination thereof. The light-blocking material may be disposed in a polymeric resin such as a phenolic resin, an acrylic resin, a polyimide resin, a polyamide resin, a siloxane resin, an epoxy resin or the like.

The first electrode EL1 may function as an anode. In an embodiment, for example, the first electrode EL1 may be provided or formed as a transmitting electrode or a reflecting electrode according to an emission type of the display device 10. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The organic layer OL may include at least an emission layer, and may further include at least one of a hole injection layer ("HIL"), a hole transporting layer ("HTL"), an electron transporting layer ("ETL") and an electron injection layer ("EIL"). In an embodiment, for example, the organic layer OL may include a low molecular weight organic compound or a high molecular weight organic compound.

In an embodiment, the organic layer OL may emit a red light, a green light or a blue light. In an embodiment, the organic layer OL may emit a white light. The organic layer OL emitting a white light may have a multi-layered structure including a red-emitting layer, a green-emitting layer and a blue-emitting layer, or a single-layer structure including a combination of a red-emitting material, a green-emitting material and a blue-emitting material.

In an embodiment, the second electrode EL2 may function as a cathode. In an embodiment, for example, the second electrode EL2 may be provided or formed as a transmitting electrode or a reflecting electrode according to an emission type of the display device 10. In an embodiment, for example, the second electrode EL2 may include a metal, a metal alloy, a metal nitride, a metal fluoride, a conductive metal oxide or a combination thereof.

In an embodiment, for example, the second electrode EL2 may extend continuously over a plurality of pixels in the display area DA.

An encapsulation layer EN may be disposed on the second electrode EL2. The encapsulation layer EN may have a stacked structure of an organic thin film 214 and an inorganic thin film. In an embodiment, for example, the encapsulation layer EN may include a first inorganic thin film 212 (e.g., first inorganic layer), an organic thin film 214 disposed on the first inorganic thin film 212 and a second inorganic thin film 216 (e.g., second inorganic layer) disposed on the organic thin film 214. The encapsulation layer EN may include at least two organic thin films.

In an embodiment, for example, the organic thin film 214 includes a cured resin such as an acrylic resin, an epoxy resin, a siloxane resin or the like. In an embodiment, for example, the cured resin may be provided or formed from cross-linking reaction of monomers. In an embodiment, for example, the inorganic thin films 212 and 216 may include an inorganic material such as silicon oxide, silicon nitride, silicon oxynitride, aluminum oxide, tantalum oxide, hafnium oxide, zirconium oxide, titanium oxide or the like.

A first light-blocking layer BM1 and a first overcoating layer OC (e.g., first overcoat layer) which covers the first light-blocking layer BM1 may be disposed on the encapsulation layer EN. The first overcoating layer OC may be referred to as a low-dielectric layer.

An input-sensing part 300 may be disposed on the first overcoating layer OC. The input-sensing part 300 (e.g., input-sensing layer) may include a conductive pattern ML which includes a driving electrode DE or a sensing electrode SE for a touch-sensing screen.

A second light-blocking layer BM2 and a color filter CF (e.g., color filter layer) may be disposed on the input-sensing part 300. The display device 10 may include the second light-blocking layer BM2 facing the first light-blocking layer BM1 with the input-sensing layer therebetween, and the color filter layer facing the input-sensing layer with the second light-blocking layer BM2 therebetween. A second overcoating layer OC2 (e.g., second overcoat layer) may be disposed on the second light-blocking layer BM2 and the color filter CF. A window cover WC (e.g., window) may be disposed on the second overcoating layer OC2. In an embodiment, the display device 10 may include a light-emitting element 190 and in order from the light-emitting element 190, the encapsulation layer EN including an organic layer, a first light-blocking layer BM1, an organic dielectric layer, an input-sensing layer and a color filter layer.

A voltage may be applied to the conductive pattern ML of the input-sensing part 300 to detect an external input. Furthermore, a power voltage may be applied to the second electrode EL2 of the light-emitting element 190. Thus, a capacitor may be provided or formed between the conductive pattern ML and the second electrode EL2, and the capacitor may interfere with operation of the input-sensing part 300. In an embodiment, for example, a larger electrical capacitance of the capacitor may reduce a sensitivity of the input-sensing part 300.

Embodiments provide a configuration which may reduce an electrical capacitance of the capacitor between the conductive pattern ML and the second electrode EL2 and may reduce or effectively prevent color mixing.

In an embodiment, the first overcoating layer OC may have a permittivity less than a permittivity of the organic thin film 214 of the encapsulation layer EN. The first overcoating layer OC may have a second thickness t2 smaller than a first thickness t1 of the organic thin film 214. When the encapsulation layer EN includes at least two organic thin films, the first thickness t1 of the organic thin film 214 may be defined by summation of thicknesses of the at least two organic thin films. The first thickness t1 may represent a minimum thickness (or minimum sum of thicknesses), without being limited thereto. The second thickness t2 may be a maximum thickness, without being limited thereto.

In an embodiment, for example, a ratio of the second thickness t2 of the first overcoating layer OC to the first thickness t1 of the organic thin film 214 may be about 1:4 to about 1:1.5. Summation the second thickness t2 of the first overcoating layer OC and the first thickness t1 of the organic thin film 214 may be predetermined in a range. In an embodiment, for example, a sum of the second thickness t2 of the first overcoating layer OC and the first thickness t1 of the organic thin film 214 may be about 4 micrometers ($\mu m$) to about 10 $\mu m$).

When the second thickness t2 of the first overcoating layer OC is excessively large, the first thickness t1 of the organic thin film 214 is relatively reduced. Thus, encapsulation characteristics of the encapsulation layer EN may be deteriorated. When the second thickness t2 of the first overcoating layer OC is excessively small, an electrical capacitance may be minimally reduced.

In an embodiment, for example, a dielectric constant of the first overcoating layer OC may be equal to or less than about 3.0 farads per meter (F/m), about 2.7 F/m or about 2.5 F/m. In an embodiment, a dielectric constant of the first overcoating layer OC may be about 2.0 F/m to about 2.7 F/m.

In an embodiment, the first overcoating layer OC may have a dielectric constant smaller than a dielectric constant of the organic thin film 214 of the encapsulation layer EN. In an embodiment, for example, a dielectric constant of the first overcoating layer OC may be equal to or less than about 2.7 F/m, and a dielectric constant of the organic thin film 214 of the encapsulation layer EN is more than about 2.7 F/m.

However, embodiments are not limited thereto. In an embodiment, for example, the organic thin film 214 of the encapsulation layer EN may have a dielectric constant similar to or less than a dielectric constant of the first overcoating layer OC to have a low-dielectric configuration.

In an embodiment, the first overcoating layer OC may include a hollow particle HP including a plurality of hollow particles HP in a base material. In an embodiment, for example, the hollow particles HP may include silica ($SiO_2$), magnesium fluoride ($MgF_2$), iron oxide ($Fe_3O_4$) or a combination thereof. In an embodiment, the hollow particles HP may include silica.

A content of the hollow particles HP, a dimension or size or the like may be adjusted depending on a desired permittivity of the first overcoating layer OC.

The first overcoating layer OC may include an organic material to provide an organic dielectric layer. In an embodiment, for example, the first overcoating layer OC may include a cured resin of an epoxy resin, an acrylic resin, a siloxane resin or the like. The hollow particles HP may be dispersed in the cured resin as a base material. In an embodiment, the organic dielectric layer which is between the encapsulation layer EN and the input-sensing layer includes an organic material, and hollow particles HP which are in the organic material.

The first light-blocking layer BM1 and the second light-blocking layer BM2 may each include a light-blocking material. The light-blocking material may include a pigment, a dye, carbon black or combination thereof. The first light-blocking layer BM1 and the second light-blocking layer BM2 may include or be formed from a conventionally know black matrix material.

In an embodiment, the first light-blocking layer BM1 and the second light-blocking layer BM2 may include a third opening and a fourth opening overlapping or corresponding to a light-emitting area of the display device 10. The third opening and the fourth opening may be aligned with each other along the thickness direction. In an embodiment, for example, the third opening of the first light-blocking layer BM1 may overlap or correspond to the second opening of the pixel-defining layer PDL. A solid portion of the first light-blocking layer BM1 and the second light-blocking layer BM2 may define the respective openings thereof.

A second width W2 of the third opening of the first light-blocking layer BM1 may be larger than a first width W1 of the second opening of the pixel-defining layer PDL. The fourth opening of the second light-blocking layer BM2 may overlap the third opening of the first light-blocking layer BM1. A third width W3 of the fourth opening of the second light-blocking layer BM2 may be larger than a second width W2 of the third opening of the first light-blocking layer BM1. A solid portion of the first light-blocking layer BM1 and the second light-blocking layer BM2 may each overlap the conductive pattern ML of the input-sensing part 300.

The input-sensing part 300 may include a lower protective layer 312, an interlayer insulation layer 314 on the lower protective layer 312, the conductive pattern ML on the interlayer insulation layer 314 and an upper protective layer 316 on the conductive pattern ML. In an embodiment, for example, a lower conductive pattern including the connection pattern BR illustrated in FIG. 2 may be disposed between the lower protective layer 312 and the interlayer insulation layer 314.

The lower protective layer 312, the interlayer insulation layer 314 and the upper protective layer 316 may each include an inorganic material. In an embodiment, for example, the lower protective layer 312, the interlayer insulation layer 314 and the upper protective layer 316 may each include silicon oxide, silicon nitride, silicon oxynitride or a combination thereof, and may each have a single-layered structure or a multi-layered structure including different materials.

The second light-blocking layer BM2 and the color filter CF are disposed on the input-sensing part 300. The second light-blocking layer BM2 and the color filter CF may be coplanar with each other. The color filter CF may overlap the fourth opening of the second light-blocking layer BM2. The color filter CF may selectively transmit a light having a color of a corresponding pixel. In an embodiment, for example, the color filter CF may selectively transmit a red light, a green light or a blue light. The color filter CF may be provided in plural in a color filter layer including color filters CF adjacent to each other along the input-sensing part 300 may selectively transmit lights having different colors.

The second overcoating layer OC2 may include an organic material. In an embodiment, for example, the second overcoating layer OC2 may include an organic material such as an epoxy resin, an acrylic resin, a siloxane resin or the like.

The window cover WC may include a rigid material such as glass, a polymeric film or a combination thereof.

Figure 4:
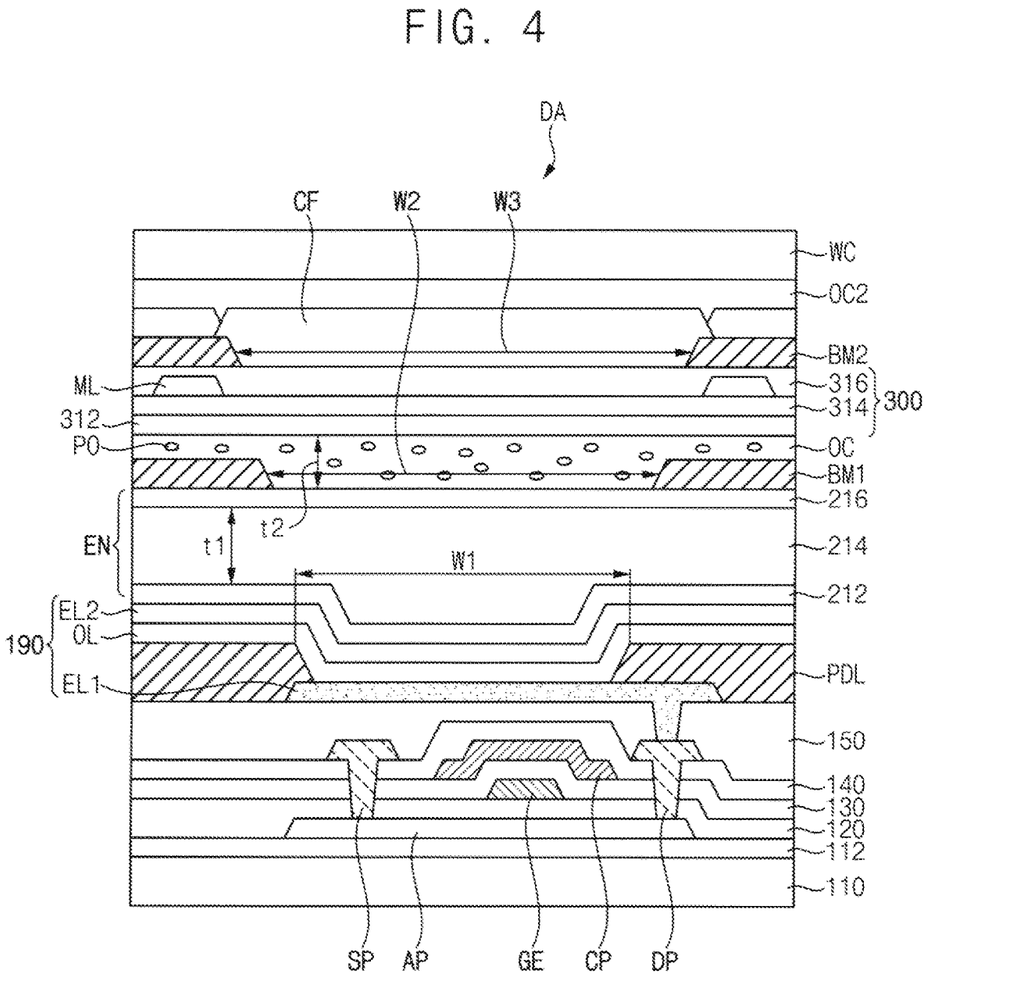
FIGS. 4, 5 and 6 are cross-sectional views illustrating embodiments of a display device.

Referring to FIG. 4, a display device 10 includes a light-emitting element 190, an encapsulation layer EN covering the light-emitting element 190 and including an organic thin film 214, a first overcoating layer OC disposed on the encapsulation layer EN, and an input-sensing part 300 disposed on the first overcoating layer OC. A first light-blocking layer BM1 may be disposed between the first overcoating layer OC and the encapsulation layer EN. A second light-blocking layer BM2 may be disposed on the input-sensing part 300.

In an embodiment, a second thickness t2 of the first overcoating layer OC may be smaller than a first thickness t1 of the organic thin film 214. In an embodiment, for example, a ratio of the second thickness t2 of the first overcoating layer OC to the first thickness t1 of the organic thin film 214 may be about 1:4 to about 1:1.5.

In an embodiment, the first overcoating layer OC includes a nano-pore PO provided in plurality include a plurality of nano-pores PO. In an embodiment, for example, the nano-pores PO may include or be formed by a siloxane copolymer. The siloxane copolymer may have a molecular sieve structure such as silsesquioxanes. Nano-pores may be provided or formed in the molecular sieve structure. In an embodiment, the organic dielectric layer which is between the encapsulation layer EN and the input-sensing layer includes an organic material, and nano-pores PO defined by the organic material. In an embodiment, for example, a size of the nano-pores PO may include a dimension about 1 nanometer (nm) to about 10 nanometers (nm).

In an embodiment, the first overcoating layer OC may have a dielectric constant smaller than a dielectric constant of the organic thin film 214 of the encapsulation layer EN. In an embodiment, for example, a dielectric constant of the first overcoating layer OC may be equal or less than about 2.7 F/m, and a dielectric constant of the organic thin film 214 of the encapsulation layer EN is more than about 2.7 F/m.

Figure 5:
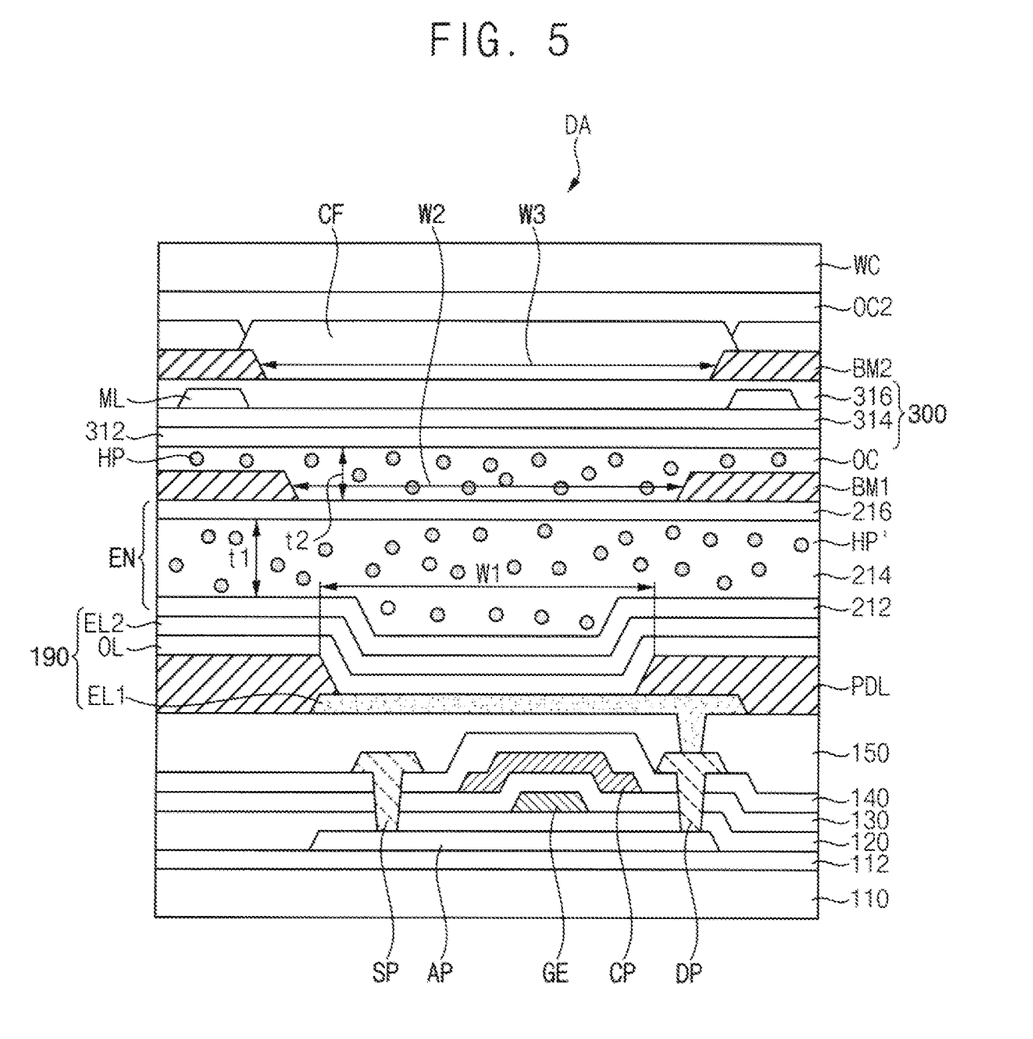

Referring to FIG. 5, a display device 10 includes a light-emitting element 190, an encapsulation layer EN covering the light-emitting element 190 and including an organic thin film 214, a first overcoating layer OC disposed on the encapsulation layer EN, and an input-sensing part 300 disposed on the first overcoating layer OC. A first light-blocking layer BM1 may be disposed between the first overcoating layer OC and the encapsulation layer EN. A second light-blocking layer BM2 may be disposed on the input-sensing part 300.

In an embodiment, the first overcoating layer OC and the organic thin film 214 may each include hollow particles HP and HP', respectively.

In an embodiment, a second thickness t2 of the first overcoating layer OC may be smaller than a first thickness t1 of the organic thin film 214. The first overcoating layer OC may have a dielectric constant smaller than a dielectric constant of the organic thin film 214 of the encapsulation layer EN. In an embodiment, for example, a content of the hollow particles HP' in the organic thin film 214 may be smaller than a content of the hollow particles HP of the first overcoating layer OC. Content may refer to a quantity, density, percentage, etc. When a content of the hollow particles HP' in the organic thin film 214 is excessively large, a roughness of the organic thin film 214 may be increased. As a result, a reliability of the encapsulation layer EN may be reduced.

However, embodiments are not limited thereto. In an embodiment, for example, the organic thin film 214 of the encapsulation layer EN may have a dielectric constant similar to or less than a dielectric constant of the first overcoating layer OC to have a low-dielectric configuration. In an embodiment, for example, a content of the hollow particles HP' in the organic thin film 214 may be equal to or greater than a content of the hollow particles HP of the first overcoating layer OC.

Figure 6:
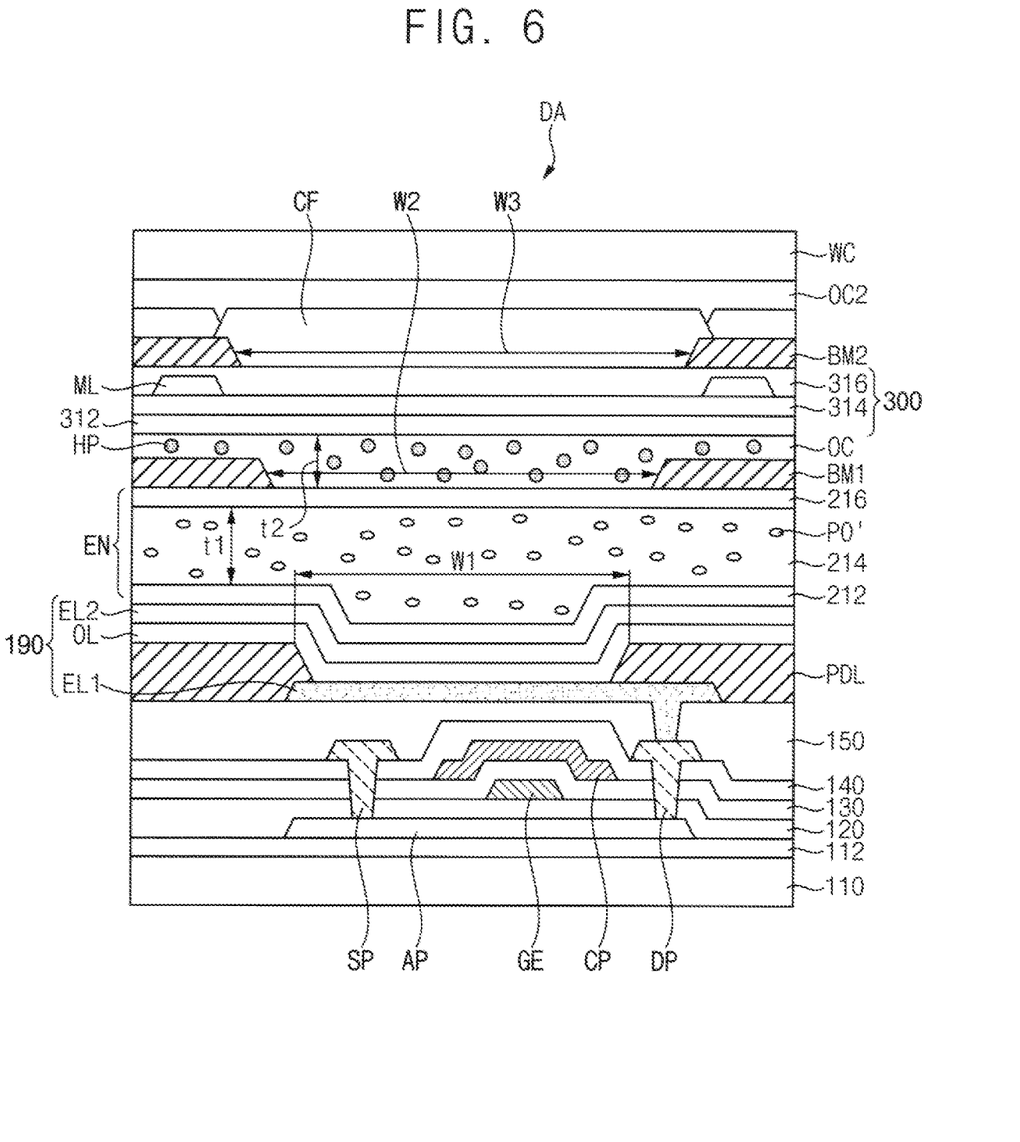

Referring to FIG. 6, a display device 10 includes a light-emitting element 190, an encapsulation layer EN covering the light-emitting element 190 and including an organic thin film 214, a first overcoating layer OC disposed on the encapsulation layer EN, and an input-sensing part 300 disposed on the first overcoating layer OC. A first light-blocking layer BM1 may be disposed between the first overcoating layer OC and the encapsulation layer EN. A second light-blocking layer BM2 may be disposed on the input-sensing part 300.

In an embodiment, the first overcoating layer OC may include hollow particles HP. The organic thin film 214 may include nano-pores PO'.

In an embodiment, a second thickness t2 of the first overcoating layer OC may be smaller than a first thickness t1 of the organic thin film 214. The first overcoating layer OC may have a dielectric constant smaller than a dielectric constant of the organic thin film 214 of the encapsulation layer EN.

However, embodiments are not limited thereto. In an embodiment, for example, the organic thin film 214 of the encapsulation layer EN may have a dielectric constant similar to or less than a dielectric constant of the first overcoating layer OC to have a low-dielectric configuration.

According to embodiments, a low-dielectric layer having a less permittivity is provided between an input-sensing part 300 and an encapsulation layer EN covering a light-emitting element 190. As a result, an electrical capacitance of a capacitor provided or formed between a conductive pattern of the input-sensing part 300 and an electrode of the light-emitting element 190 is decreased. Thus, a sensitivity of the input-sensing part 300 may be increased.

Furthermore, a light-blocking layer is provided between the low-dielectric layer and the encapsulation layer EN. Thus, mixing of color light emitted by pixels may be reduced or prevented.

In an embodiment, a display device 10 may exclude a polarizing member. Thus, a thickness of a display device 10 may be reduced, and the display device 10 may have increased durability against stress generated by bending or deforming of the display device 10. Thus, one or more embodiment of the display device 10 may be effectively used for a foldable display device, a rollable display device or the like, which has a bending area at which the display device 10 is foldable, rollable, etc.

In embodiments, a method for providing or forming a low-dielectric layer, and a combination of a low-dielectric layer and an organic thin film 214 are not limited to the above.

In an embodiment, for example, a first overcoating layer OC and an organic thin film 214 of an encapsulation layer EN may each include nano-pores PO. Dielectric constants of the first overcoating layer OC and the organic thin film 214 may be adjusted depending on a content of the nano-pores PO within the respective layers.

In an embodiment, a first overcoating layer OC and an organic thin film 214 of an encapsulation layer EN may each include an acrylic copolymer. An acrylic monomer in the acrylic copolymer may include an aromatic ring structure. In an embodiment, for example, the acrylic monomer may include at least an aromatic acrylate such as benzyl(meth) acrylate, styrene or the like. In an embodiment, the organic dielectric layer which is between the encapsulation layer EN and the input-sensing layer includes an acrylic copolymer having monomers, and the monomers of the acrylic copolymer includes an aromatic acrylate. The first overcoating layer OC and the organic thin film 214 which include or are formed from the aromatic acrylate, may have a reduced dielectric constant.

Embodiments are not limited to an organic light-emitting display device. In an embodiment, for example, embodiments may be used for various display devices such as an inorganic electroluminescent display device, a micro light-emitting diode ("LED") display device or the like.

Embodiments may be applied to various display devices. In an embodiment, for example, embodiments may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings of the invention. Accordingly, all such modifications are intended to be included within the scope of the invention. Therefore, it is to be understood that the foregoing is illustrative of various embodiments and is not to be construed as limited to the specific embodiments disclosed, and that modifications to the disclosed embodiments, as well as other embodiments, are intended to be included within the scope of the invention, as set forth in the following claims and equivalents thereof.

What is claimed is:

1. A display device comprising:
a light-emitting element;
an encapsulation layer covering the light-emitting element, the encapsulation layer including an organic layer having a dielectric constant and a first thickness;
an input-sensing layer facing the light-emitting element with the encapsulation layer therebetween and including an insulation layer and a conductive pattern which is on the insulation layer;
an organic dielectric layer between the encapsulation layer and the input-sensing layer; and
a first light-blocking layer between the organic dielectric layer and the input-sensing layer,
wherein the organic dielectric layer which is between the encapsulation layer and the input-sensing layer has a second thickness which is smaller than the first thickness of the organic layer of the encapsulation layer.

2. The display device of claim 1, wherein
the organic dielectric layer has a dielectric constant which is smaller than the dielectric constant of the organic layer of the encapsulation layer, and
the dielectric constant of the organic dielectric layer which is between the encapsulation layer and the input-sensing layer is equal to or less than about 2.7 farads per meter.

3. The display device of claim 1, wherein a ratio of the second thickness of the organic dielectric layer to the first thickness of the organic layer of the encapsulation layer is about 1:4 to about 1:1.5.

4. The display device of claim 3, wherein a sum of the second thickness of the organic dielectric layer and the first thickness of the organic layer of the encapsulation layer is about 4 micrometers to about 10 micrometers.

5. The display device of claim 1, wherein the organic dielectric layer which is between the encapsulation layer and the input-sensing layer includes:
an organic material, and
hollow particles which are in the organic material.

6. The display device of claim 1, wherein the organic dielectric layer which is between the encapsulation layer and the input-sensing layer includes:
an organic material, and
nano-pores defined by the organic material.

7. The display device of claim 1, wherein
the organic dielectric layer which is between the encapsulation layer and the input-sensing layer includes an acrylic copolymer having monomers, and
the monomers of the acrylic copolymer includes an aromatic acrylate.

8. The display device of claim 1, wherein
the organic dielectric layer which is between the encapsulation layer and the input-sensing layer includes an organic material, and
the organic material includes an acrylic resin, an epoxy resin or a siloxane resin.

9. The display device of claim 1, wherein the first light-blocking layer includes a first opening.

10. The display device of claim 9, wherein the light-emitting element includes a first electrode, a second electrode facing the first electrode, and an emission layer between the first electrode and the second electrode,
further comprising:
a pixel-defining layer which covers edges of the first electrode, and
a second opening in the pixel-defining layer which corresponds to the first opening in the first light-blocking layer.

11. The display device of claim 10, further comprising:
a second light-blocking layer facing the first light-blocking layer with the input-sensing layer therebetween, and
a third opening in the second light-blocking layer which corresponds to the second opening in the pixel-defining layer.

12. The display device of claim 11, wherein
the first opening, the second opening and the third opening has a first width, a second width and a third width, respectively, along the input-sensing layer,
the first width of the first opening in the first light-blocking layer is greater than the second width of the second opening in the pixel-defining layer, and
the third width of the third opening in the second light-blocking layer is greater than the first width of the first opening in the first light-blocking layer.

13. The display device of claim 11, wherein the input-sensing layer includes the conductive pattern corresponding to the first light-blocking layer and the second light-blocking layer.

14. The display device of claim 11, further comprising a color filter layer facing the input-sensing layer with the second light-blocking layer therebetween,
wherein the color filter layer extends into the third opening in the second light-blocking layer.

15. A display device comprising:
a light-emitting element;
an encapsulation layer including an organic layer, on the light-emitting element;
an input-sensing layer including an insulation layer and a conductive pattern which is on the insulation layer;
an organic dielectric layer between the encapsulation layer and the conductive pattern of the input-sensing layer;
a color filter layer; and
a first light-blocking layer defining an opening in the first light-blocking layer,
wherein
the organic dielectric layer extends from between the encapsulation layer and the conductive pattern of the input-sensing layer, and into the opening of the first light-blocking layer,
each of the organic dielectric layer and the organic layer of the encapsulation layer has a dielectric constant,
the dielectric constant of the organic dielectric layer is smaller than the dielectric constant of the organic layer of the encapsulation layer, and
the dielectric constant of the organic dielectric layer is equal to or less than about 2.7 farads per meter.

16. The display device of claim 15, wherein the organic dielectric layer includes:
an organic material, and
hollow particles which are in the organic material.

17. The display device of claim 15, wherein the organic dielectric layer includes:
an organic material, and
nano-pores defined by the organic material.

18. The display device of claim 15, wherein
the organic dielectric layer includes an acrylic copolymer having monomers, and
the monomers of the acrylic copolymer includes an aromatic acrylate.

19. A display device comprising:
a light-emitting element;
an encapsulation layer including an organic layer, on the light-emitting element;
an input-sensing layer including an insulation layer and a conductive pattern which is on the insulation layer;
an organic dielectric layer between the encapsulation layer and the conductive pattern of the input-sensing layer;
a color filter layer; and
a first light-blocking layer defining an opening in the first light-blocking layer,
wherein
the organic dielectric layer extends from between the encapsulation layer and the conductive pattern of the input-sensing layer, and into the opening of the first light-blocking layer,
the organic dielectric layer has a first thickness and the organic layer of the encapsulation layer has a second thickness, and
a ratio of the first thickness of the organic dielectric layer to the thickness of the organic layer of the encapsulation layer is about 1:4 to about 1:1.5.

* * * * *